US012640593B2

(12) United States Patent
Shetty et al.

(10) Patent No.: US 12,640,593 B2
(45) Date of Patent: May 26, 2026

(54) WAKE-UP RECEIVER

(71) Applicant: Cypress Semiconductor Corporation, San Jose, CA (US)

(72) Inventors: Darshan Bhaskar Shetty, Graz (AT); Christoph Steffan, Marchtrenk (AT); Gerald Holweg, Graz (AT)

(73) Assignee: Infineon Technologies Americas Corp., El Segundo, CA (US)

( * ) Notice: Subject to any disclaimer, the term of this patent is extended or adjusted under 35 U.S.C. 154(b) by 187 days.

(21) Appl. No.: 18/108,928

(22) Filed: Feb. 13, 2023

(65) Prior Publication Data

US 2024/0072578 A1 Feb. 29, 2024

Related U.S. Application Data

(60) Provisional application No. 63/402,454, filed on Aug. 30, 2022.

(51) Int. Cl.
| | |
|---|---|
| *H02J 50/27* | (2016.01) |
| *G16Y 40/35* | (2020.01) |
| *H01Q 7/00* | (2006.01) |
| *H02J 50/00* | (2016.01) |
| *H03K 17/56* | (2006.01) |

(52) U.S. Cl.
CPC .............. *H02J 50/27* (2016.02); *G16Y 40/35* (2020.01); *H01Q 7/00* (2013.01); *H02J 50/001* (2020.01); *H03K 17/56* (2013.01)

(58) Field of Classification Search
CPC ........ H02J 50/001; H02J 50/27; G16Y 40/35; H01Q 7/00; H03K 17/56
See application file for complete search history.

(56) References Cited

U.S. PATENT DOCUMENTS

| | | | | |
|---|---|---|---|---|
| 4,608,567 A | * | 8/1986 | Bryant | ..................... H03D 1/00 |
| | | | | 342/194 |
| 7,358,807 B2 | * | 4/2008 | Scuderi | .................... H03F 1/52 |
| | | | | 330/279 |
| 10,804,946 B2 | | 10/2020 | Wang et al. | |

(Continued)

FOREIGN PATENT DOCUMENTS

EP 3047619 B1 8/2018

OTHER PUBLICATIONS

Darshan Shetty, et al. "Fully Passive Sub-GHz WuRx including a Loop Antenna with -31 dBm Sensitivity at 12 kbps bit-rate", Cooperative Research and Exploration Department, Infineon Technologies Austria AG, Graz, Austria, pp. 1-5.

(Continued)

*Primary Examiner* — Daniel Cavallari
*Assistant Examiner* — Joseph N Inge
(74) *Attorney, Agent, or Firm* — Cooper Legal Group LLC

(57) ABSTRACT

One or more devices, systems, and/or methods are provided. In an example of the techniques presented herein, a wake-up receiver includes a power management unit configured to receive a supply voltage generated from an input signal and generate a current reference. An envelope detector is configured to generate a signal corresponding to transitions in the input signal. A signal processing unit is configured to generate an interrupt signal responsive to detecting a wake-up pattern in the signal from the envelope detector. The envelope detector comprises a first diode threshold compensated by the current reference.

20 Claims, 9 Drawing Sheets

(56)                References Cited

U.S. PATENT DOCUMENTS

| 10,892,719 | B2 * | 1/2021 | Choi | H03F 1/0211 |
| 11,342,924 | B2 | 5/2022 | Yehezkely et al. | |
| 11,374,587 | B1 | 6/2022 | Huynh | |
| 2007/0087719 | A1 * | 4/2007 | Mandal | H01Q 1/22 |
| | | | | 455/299 |
| 2011/0065410 | A1 * | 3/2011 | Huang | H03D 1/22 |
| | | | | 455/312 |
| 2011/0159812 | A1 * | 6/2011 | Kim | H04B 5/266 |
| | | | | 307/104 |
| 2011/0317601 | A1 * | 12/2011 | Bekritsky | H04W 52/0229 |
| | | | | 370/311 |
| 2012/0093245 | A1 * | 4/2012 | Makdissi | A61B 5/0028 |
| | | | | 375/259 |
| 2012/0153742 | A1 * | 6/2012 | Lee | H02J 50/80 |
| | | | | 307/104 |
| 2013/0265140 | A1 * | 10/2013 | Gudan | H04W 52/0245 |
| | | | | 340/10.3 |
| 2014/0062672 | A1 * | 3/2014 | Gudan | G06K 19/0715 |
| | | | | 340/10.33 |

| 2015/0136857 | A1 * | 5/2015 | Pillin | G06K 19/07 |
| | | | | 235/492 |
| 2017/0343589 | A1 * | 11/2017 | Mukherjee | H03D 1/2272 |
| 2019/0018472 | A1 * | 1/2019 | Elboim | G06F 15/7807 |
| 2019/0158133 | A1 * | 5/2019 | Wang | H04B 1/1615 |
| 2021/0377859 | A1 * | 12/2021 | Katan Baf Nezhad | |
| | | | | H02J 50/001 |
| 2022/0131424 | A1 * | 4/2022 | Charthad | H02J 50/402 |

OTHER PUBLICATIONS

Darshan Shetty, et al. "Process and temperature variation robust, nanowatt startup RF Energy Harvester", Cooperative Research and Exploration Department, Infineon Technologies Austria AG, Graz, Austria, pp. 1-4.

Darshan Shetty, et al. "Submicrowatt CMOS Rectifier for a Fully Passive Wake-Up Receiver", IEEE Transactions on Microwave Theory and Techniques, vol. 69, No. 11, Nov. 2021, pp. 4803-4812.

* cited by examiner

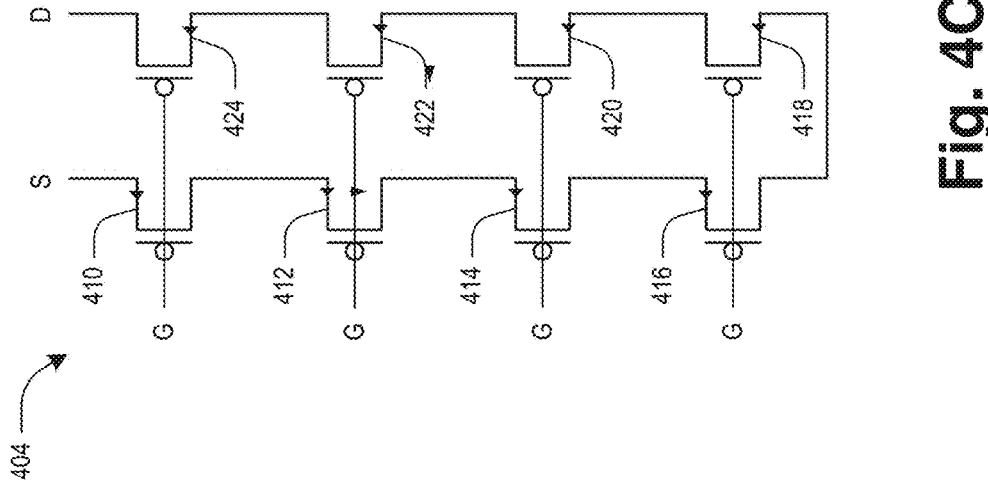
Fig. 4C
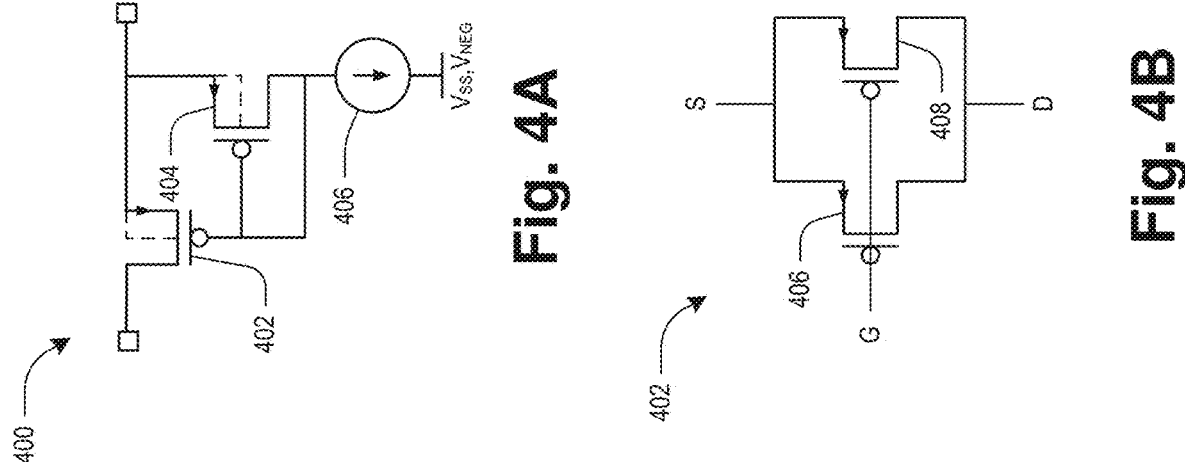
Fig. 4A
Fig. 4B

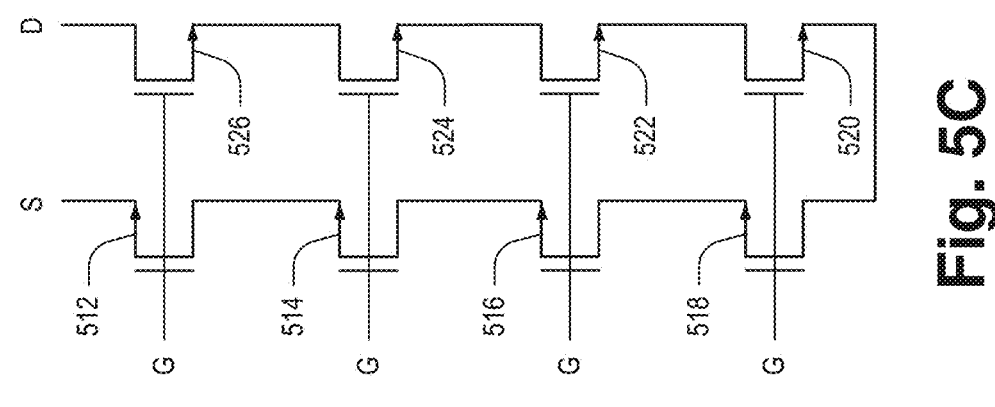
Fig. 5C
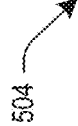
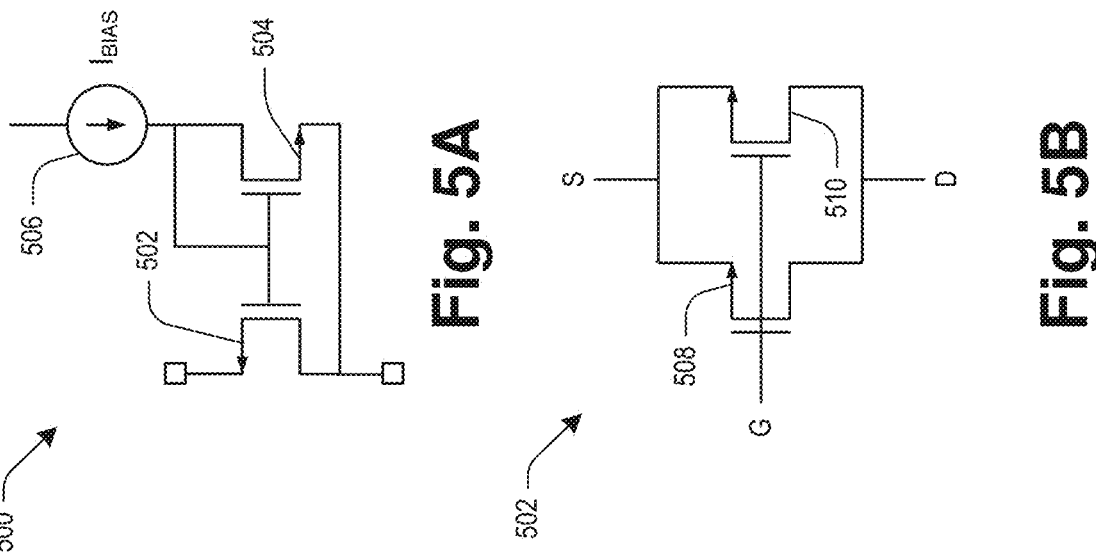
Fig. 5A
Fig. 5B

900

RECEIVE RF INPUT SIGNAL — 902

HARVEST ENERGY FROM RF INPUT SIGNAL TO GENERATE SUPPLY VOLTAGE — 904

GENERATE CURRENT REFERENCE BASED ON SUPPLY VOLTAGE — 906

GENERATE SIGNAL CORRESPONDING TO TRANSITIONS IN RF INPUT SIGNAL USING FIRST DIODE — 908

COMPENSATE THRESHOLD OF FIRST DIODE USING CURRENT REFERENCE — 910

WAKE-UP RECEIVER

BACKGROUND

Low power networked devices, such as Internet of Things (IoT) devices require energy efficiency. The vast networks of battery-operated low-power IoT devices are constrained by their battery usage. Application fields such as home automation require IoT devices that operate in random-sparse event modes, which result in high power consumption due to idle listening time of a transceiver.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an example of the techniques presented herein, a wake-up receiver includes a power management unit configured to receive a supply voltage generated from an input signal and generate a current reference. An envelope detector is configured to generate a signal corresponding to transitions in the input signal. A signal processing unit is configured to generate an interrupt signal responsive to detecting a wake-up pattern in the signal from the envelope detector. The envelope detector comprises a first diode threshold compensated by the current reference.

In an example of the techniques presented herein, a system comprises a radio frequency to direct current (RF-DC) converter configured to generate a supply voltage based on an RF input signal, a power management unit configured to receive the supply voltage and generate a current reference, and an envelope detector configured to generate a signal corresponding to transitions in the RF input signal, wherein the envelope detector comprises a first diode threshold compensated by the current reference, and the RF-DC converter comprises a second diode threshold compensated by the current reference.

In an example of the techniques presented herein, a system, comprises means for receiving a radio frequency (RF) input signal, means for harvesting energy from the RF input signal to generate a supply voltage, means for generating a current reference based on the supply voltage, means for generating a signal corresponding to transitions in the RF input signal using a first diode, and means for compensating a threshold of the first diode using the current reference.

In an example of the techniques presented herein, a method, comprises receiving a radio frequency (RF) input signal, harvesting energy from the RF input signal to generate a supply voltage, generating a current reference based on the supply voltage, generating a signal corresponding to transitions in the RF input signal using a first diode, and compensating a threshold of the first diode using the current reference.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 4A is a diagram of a p-type threshold compensated diode, in accordance with some embodiments.

FIG. 4B is a diagram of a p-type rectification transistor, in accordance with some embodiments.

FIG. 4C is a diagram of a p-type compensation transistor, in accordance with some embodiments.

FIG. 5A is a diagram of an n-type threshold compensated diode, in accordance with some embodiments.

FIG. 5B is a diagram of an n-type rectification transistor, in accordance with some embodiments.

FIG. 5C is a diagram of an n-type compensation transistor, in accordance with some embodiments.

DETAILED DESCRIPTION

Figure 1:
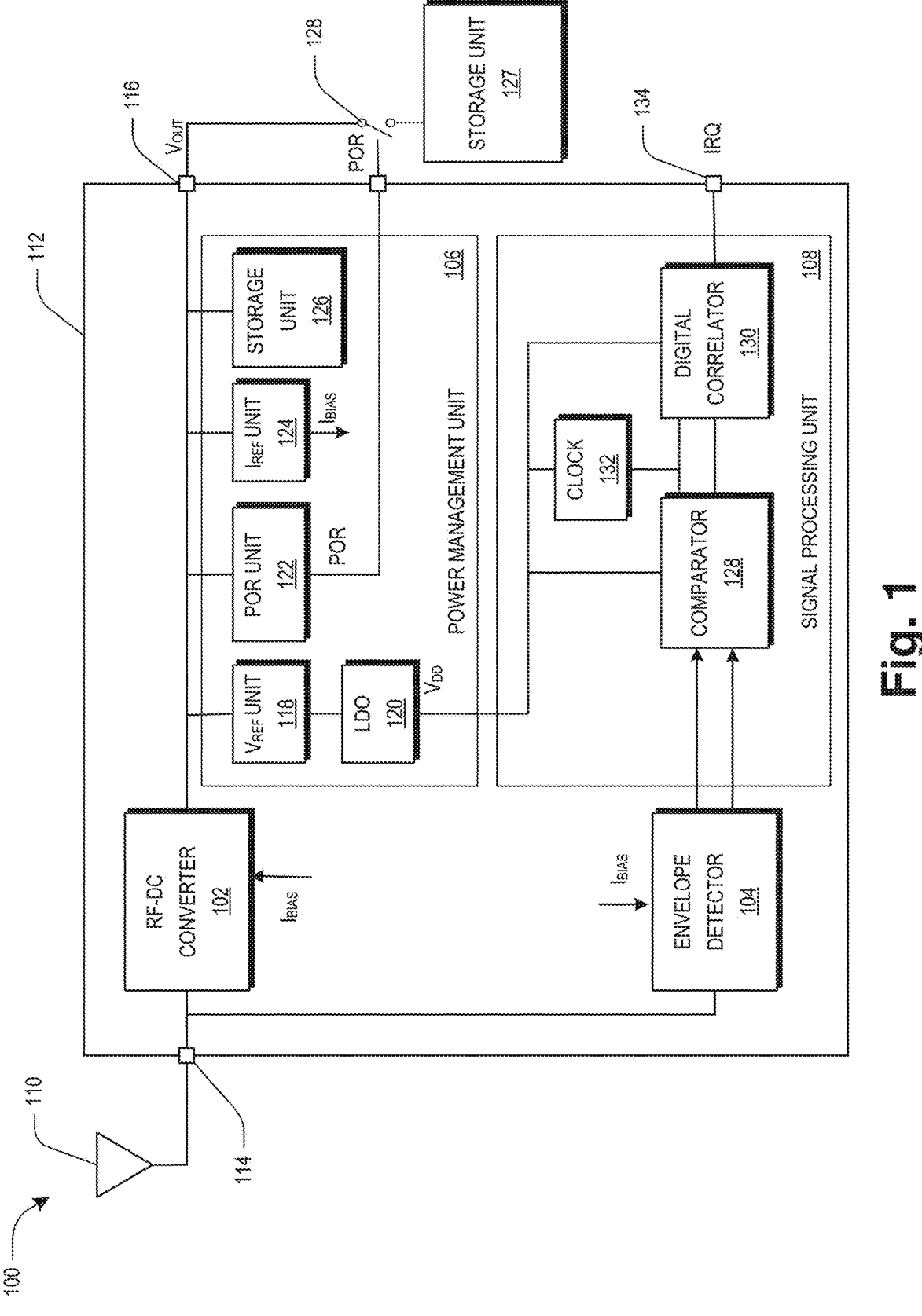
FIG. 1 is a block diagram of a wake-up receiver (WuRX), in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

According to some embodiments, a wake-up receiver (WuRX) harvests energy from a radio frequency (RF) signal and generates a direct current (DC) voltage for use by components of the WURX. The WuRX includes an RF-DC converter to harvest the energy, and an envelope detector to detect a wake-up signal embedded in the RF signal. In some embodiments, the RF-DC converter and/or the envelope detector employs threshold compensated diodes that include series connected primary transistors and parallel connected compensation. The threshold compensated diodes to decrease sensitivity to process corner variation and temperature variation. The WuRX can be said to be passive because it does not require energy from a battery. Instead, the WuRX uses energy harvested from the RF signal. Harvesting energy from the RF signal allows an associated IoT device, for example, to operate in an energy efficient manner by staying in a sleep state unless/until it is activated by a wake-up signal.

FIG. 1 is a block diagram of a WuRX 100, in accordance with some embodiments. In some embodiments, the WuRX 100 comprises an RF-DC converter 102, an envelope detector 104, a power management unit 106, a signal processing unit 108, and an antenna 110. The RF-DC converter 102, the envelope detector 104, the power management unit 106, and the signal processing unit 108 may be provided on a semiconductor die 112, and the antenna 110 may connected to an input terminal 114 of the semiconductor die 112. The antenna 110 and the semiconductor die 112 may be provided on a printed circuit board. The antenna 110 may be a loop antenna, such as a small loop antenna, matched to the input impedance of the envelope detector 104. The WuRX 100 is fully passive in it does not require energy from a battery or an external voltage source, but rather harvests energy from the RF input signal. Other structures and/or configurations of the WuRX 100 are within the scope of the present disclosure.

The RF-DC converter 102 is an energy harvester that receives an RF signal from the antenna 110, harvests energy from the RF signal, and generates a DC output voltage $V_{OUT}$ at an output terminal 116. The power management unit 106 includes a voltage reference ($V_{REF}$) unit 118, a low-dropout (LDO) regulator 120, a power on reset (POR) unit 122, a current reference ($I_{REF}$) unit 124, an internal storage unit 126, and an external storage unit 127 for storing surplus harvested energy. The LDO regulator 120 generates a supply voltage ($V_{DD}$) for the signal processing unit 108. Other structures and/or configurations of the power management unit 106 are within the scope of the present disclosure.

In some embodiments, the signal processing unit 108 comprises a comparator 128, a digital correlator 130, and a clock 132. The comparator 128 receives the output of the envelope detector 104 to identify binary transitions in the RF signal and the digital correlator 130 detects the presence of a binary pattern and generates an interrupt signal (IRQ) at an interrupt terminal 134 responsive to the binary pattern being detected. For example, a wake-up signal may be a binary pattern of 101101110101 followed by a pattern of 101010101010. The binary pattern may vary. The clock 132 generates a timing signal for the comparator 128 and the digital correlator 130. In some embodiments, the comparator 128 is a strong arm latched comparator with zero static power that generates rail-to-rail outputs. Other structures and/or configurations of the signal processing unit 108 are within the scope of the present disclosure.

Figure 2:
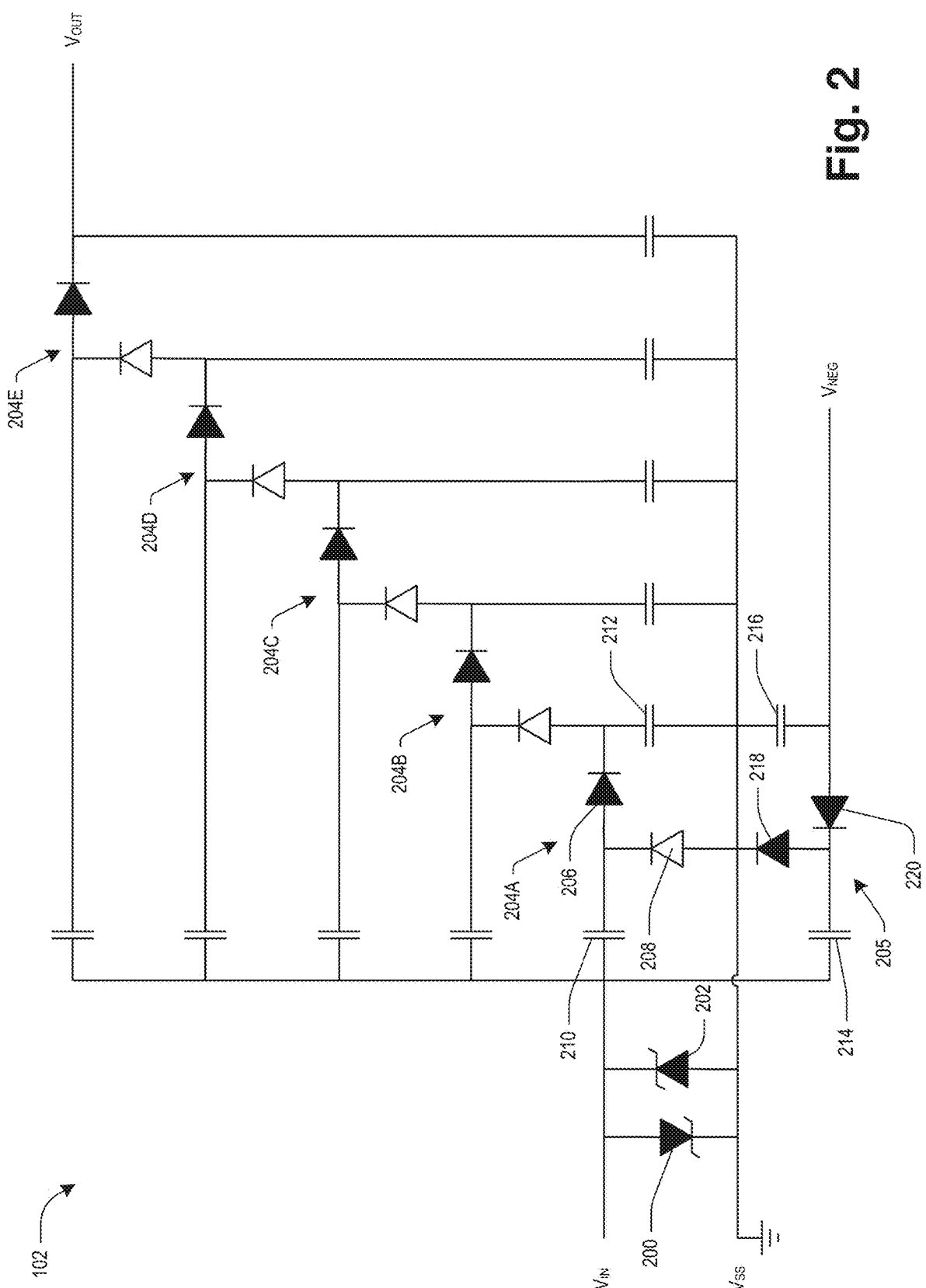
FIG. 2 is a circuit diagram of an RF-DC converter, in accordance with some embodiments.

FIG. 2 is a circuit diagram of a RF-DC converter 102, in accordance with some embodiments. The RF-DC converter 102 comprises input electrostatic discharge (ESD) protection devices 200, 202, positive gain stages 204A-204E, and a negative gain stage 205. Each positive gain stage 204A-204E comprises an n-type threshold compensated diode 206, a p-type threshold compensated diode 208, a sampling capacitor 210, and a load capacitor 212. The sampling capacitor 210 is connected to node between an output of the n-type threshold compensated diode 206 and an input of the p-type threshold compensated diode 208. The load capacitor 212 is connected to an output of the p-type threshold compensated diode 208. The negative gain stage 205 comprises a sampling capacitor 214, a load capacitor 216, and two diode-connected n-type transistors 218, 220. The negative gain stage 205 creates a negative output voltage, $V_{NEG}$, that provides a lower supply voltage for the p-type threshold compensated diode 208 in the first positive-gain stage 204A.

The ESD protection devices 200, 202 may be anti-parallel p+/n-well and n+/p-well junction diodes that provide reliable operation of the RF-DC converter 102 across a wide input power range. The gain stages 204A-204E, 205 employ a Dickson topology for voltage rectification to generate an output voltage, $V_{OUT}$.

The POR unit 122 generates a POR signal and operates the WuRX 100 in a first mode responsive to the voltage, $V_{OUT}$, of the RF-DC converter 102 exceeding a minimum voltage to allow the receipt of data in the RF input signal. In some embodiments, the POR unit 122 operates the WuRX 100 in a second mode responsive to a sufficient voltage being present to charge the storage unit 126 or to charge the storage unit 127 by activating a switch 128. In some embodiments, the storage unit 126 comprises a capacitor. The storage unit 127 may comprise a thin film battery, a solid state battery, or some other suitable energy storage device.

Figure 3:
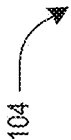
FIG. 3 is a circuit diagram of an envelope detector, in accordance with some embodiments.

FIG. 3 is a circuit diagram of the envelope detector 104, in accordance with some embodiments. The envelope detector 104 employs a Dickson topology to rectify and track the input RF signal and to provide pseudo-differential outputs, $V_{ED1}$, $V_{ED2}$, using p-type threshold compensated diodes 300, 302. The p-type threshold compensated diode 300 comprises a p-type rectification transistor 304, a p-type compensation transistor 306, and a current source 308. In some embodiments, the negative gain stage 205 creates a negative output voltage, $V_{NEG}$, that provides a lower supply voltage for the current sources 308, 314. In other embodiments, the lower supply voltage for the current sources 308, 314 is $V_{SS}$ (ground). The outputs of the p-type rectification transistor 304 and the p-type compensation transistor 306 are connected and the current source 308 is connected to the gates of the p-type rectification transistor 304 and the p-type compensation transistor 306. The threshold compensated p-type diode 302 comprises a p-type rectification transistor 310, a p-type compensation transistor 312, and a current source 314. The outputs of the p-type rectification transistor 310 and the p-type compensation transistor 312 are connected and the current source 314 is connected to the gates of the p-type rectification transistor 304 and the p-type compensation transistor 306. A capacitor 316 and a current source 318 are connected in parallel with the p-type threshold compensated diode 300. In some embodiments, the p-type compensation transistors 306, 312 are diode connected in that the inputs are connected to the gates. A capacitor 320 and a voltage divider 322 are connected in parallel with the threshold compensated p-type diode 302. The voltage divider 322 includes series connected resistors 324, 326 and a capacitor 328 connected in parallel with the resistor 326. The capacitor 316 has a much lower capacitance than the capacitor 320 so that the capacitor 316 charges more quickly to generate the $V_{ED1}$ signal compared to the charging of the capacitor 320 to generate the $V_{ED2}$ signal. The current source 318 generates a current, $N*I_{BIAS}$, that is a multiple of the current, $I_{BIAS}$, generated by the current sources 308, 314. The current source 318 provides a tunable slew rate for the envelope detector 104, as discussed below in reference to FIG. 8A. The slew rate may be tuned based on the bit-rate of the input signal.

A current reference, $I_{BIAS}$, represented by the current sources 308, 314 is generated by the current reference unit 124 in the power management unit 106 and creates a voltage drop across the p-type compensation transistors 306, 312. This voltage biases the gate nodes of the p-type rectification transistors 304, 310. As a result, the p-type rectification transistors 304, 310 are slightly forward biased to their optimal values, which may be determined using simulations. This forward biasing reduces the input impedance of the envelope detector 104 and increases the sensitivity to low amplitude signals. The slew rate may be tuned based on the bit-rate of the input signal.

FIG. 4A is a diagram of a p-type threshold compensated diode 400, such as the p-type threshold compensated diodes 208, 300, 302, in accordance with some embodiments. The p-type threshold compensated diode 400 comprises a p-type rectification transistor 402 connected to a p-type compensation transistor 404 and a current source 406 to provide the current reference, $I_{BIAS}$. The current source 406 may be referenced to $V_{NEG}$ (for the p-type threshold compensated diode 208 of the first gain stage 204A or for the p-type threshold compensated diodes 300, 302) or $V_{SS}$ (for the p-type threshold compensated diodes 208 of the other gain stages 204B-204E). The outputs of the p-type rectification transistor 402 and the p-type compensation transistor 404 are connected and the current source 406 is connected to the gates of the p-type rectification transistor 402 and the p-type compensation transistor 404. In some embodiments, the p-type compensation transistor 404 is diode connected in that the input is connected to the gate.

FIGS. 4B and 4C are diagrams of the p-type rectification transistor 402 and a p-type compensation transistor 404, respectively, in accordance with some embodiments. Referring to FIG. 4B, the p-type rectification transistors 402 comprises a first p-type unit cell transistor 406 connected in parallel with a second p-type unit cell transistor 408. The parallel arrangement of the p-type unit cell transistors 406, 408 increases the transconductance of the p-type rectification transistor 402

Referring to FIG. 4C, the p-type compensation transistor 404 comprises series connected p-type unit cell transistors 410, 412, 414, 416, 418, 420, 422, 424. The number of p-type unit cell transistors 410, 412, 414, 416, 418, 420, 422, 424 may vary. The series arrangement of the p-type unit cell transistors 410, 412, 414, 416, 418, 420, 422, 424 increases the gate length of the p-type compensation transistor 404, to facilitate the generation of the required gate pre-charge voltage for the p-type rectification transistor 402 for a given bias current, $I_{BIAS}$. The usage of unit cells helps to achieve a robustness of the generated pre-charge voltage against process corner and temperature fluctuations.

FIG. 5A is a diagram of an n-type threshold compensated diode 500, such as the n-type threshold compensated diodes 206, in accordance with some embodiments. The n-type threshold compensated diode 500 comprises an n-type rectification transistor 502 connected to an n-type compensation transistor 504 and a current source 506 to provide the current reference, $I_{BIAS}$. The outputs of the n-type rectification transistor 502 and the n-type compensation transistor 504 are connected and the current source 506 is connected to the gates of the n-type rectification transistor 502 and the n-type compensation transistor 504. In some embodiments, the n-type compensation transistor 504 is diode connected in that the input is connected to the gate.

FIGS. 5B and 5C are diagrams of the n-type rectification transistor 502 and the n-type compensation transistor 504, respectively, in accordance with some embodiments. Referring to FIG. 5B, the n-type rectification transistor 502 comprises a first n-type unit cell transistor 508 connected in parallel with a second n-type unit cell transistor 510. The parallel arrangement of the n-type unit cell transistors 508, 510 increases the transconductance of the n-type rectification transistor 502.

Referring to FIG. 5C, the n-type compensation transistor 504 comprises series connected n-type unit cell transistors 512, 514, 516, 518, 520, 522, 524, 526. The number of n-type unit cell transistors 512, 514, 516, 518, 520, 512, 522, 524, 526 may vary. The series arrangement of the n-type unit cell transistors 512, 514, 516, 518, 520, 522, 524, 526 increases the gate length of the n-type compensation transistor 504 to facilitate the generation of the required gate pre-charge voltage for the n-type rectification transistor 502 for a given bias current, $I_{BIAS}$. The usage of unit cells helps to achieve a robustness of the generated pre-charge voltage against process corner and temperature fluctuations.

Figure 6:
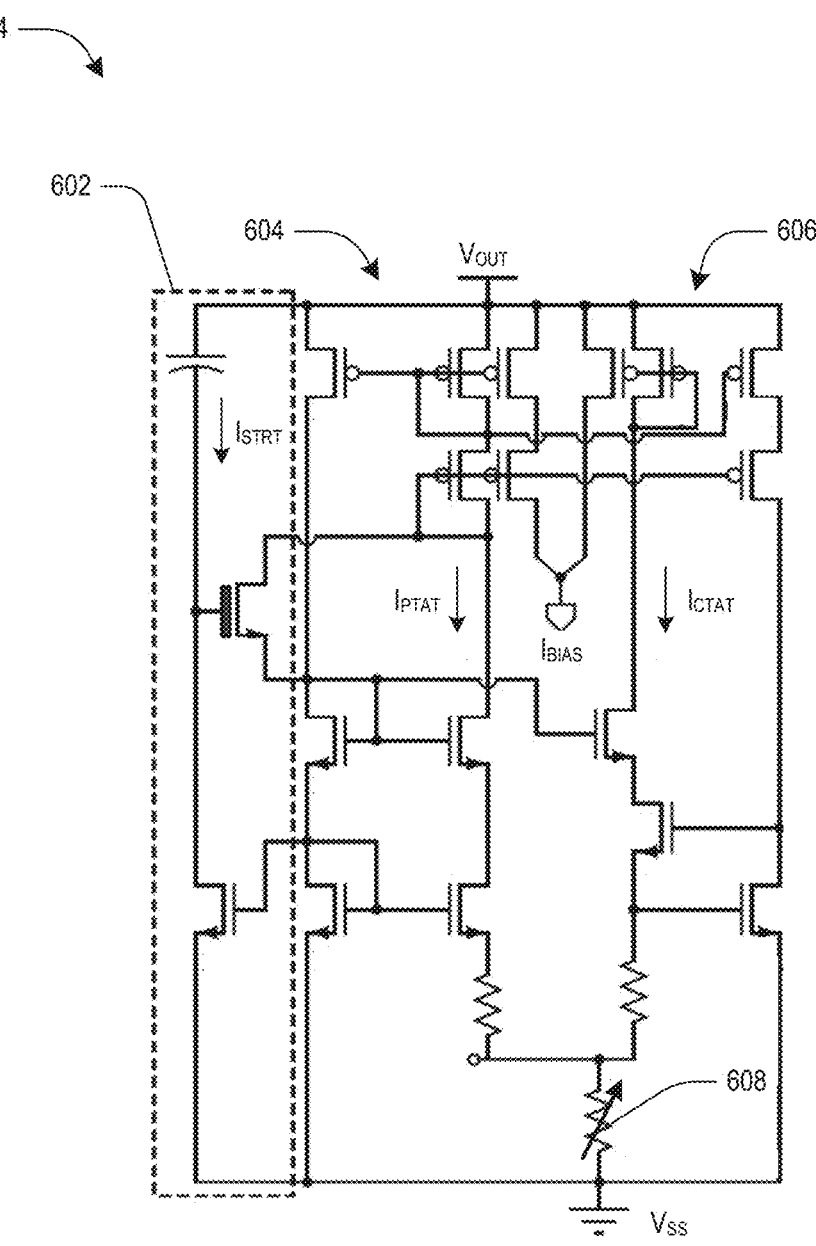
FIG. 6 is a diagram of a current reference unit, in accordance with some embodiments.

FIG. 6 is a diagram of the current reference unit 124, in accordance with some embodiments. The current reference unit 124 generates a first-order, temperature compensated current which is used as the current reference, $I_{BIAS}$, for the threshold compensated diodes 206, 208, 300, 302, 500.

In some embodiments, the current reference unit 124 comprises a start-up circuit 602 to generate a start-up current, $I_{STRT}$, a self-biased beta-multiplier current reference 604 to generate an $I_{PTAT}$ current proportional to absolute temperature, and a VGS/R current reference circuit 606 to generate an $I_{CTAT}$ current complementary to absolute temperature. The $I_{PTAT}$ and $I_{CTAT}$ currents are combined to obtain a temperature-compensated output current, $I_{BIAS}$. The $I_{PTAT}$ and $I_{CTAT}$ currents current paths are combined through a shared resistor 608. In some embodiments, the resistor 608 may be variable. The resistance value of the resistor 608 may be trimmed by selectively shorting one or more series connected resistors.

Figure 7:
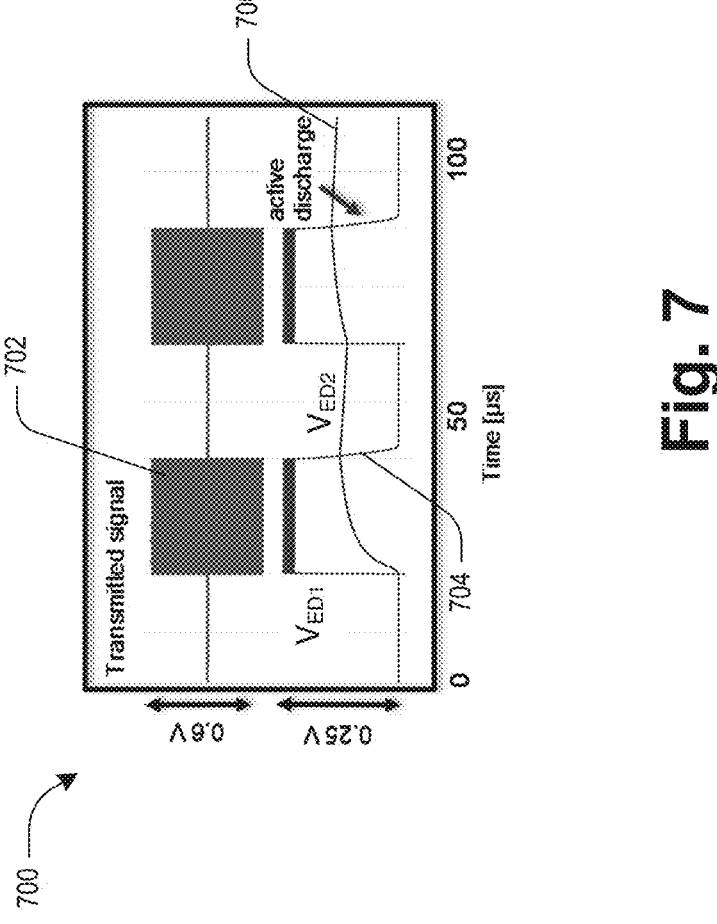
FIGS. 7 and 8 are signal diagrams, in accordance with some embodiments.
Figure 8:
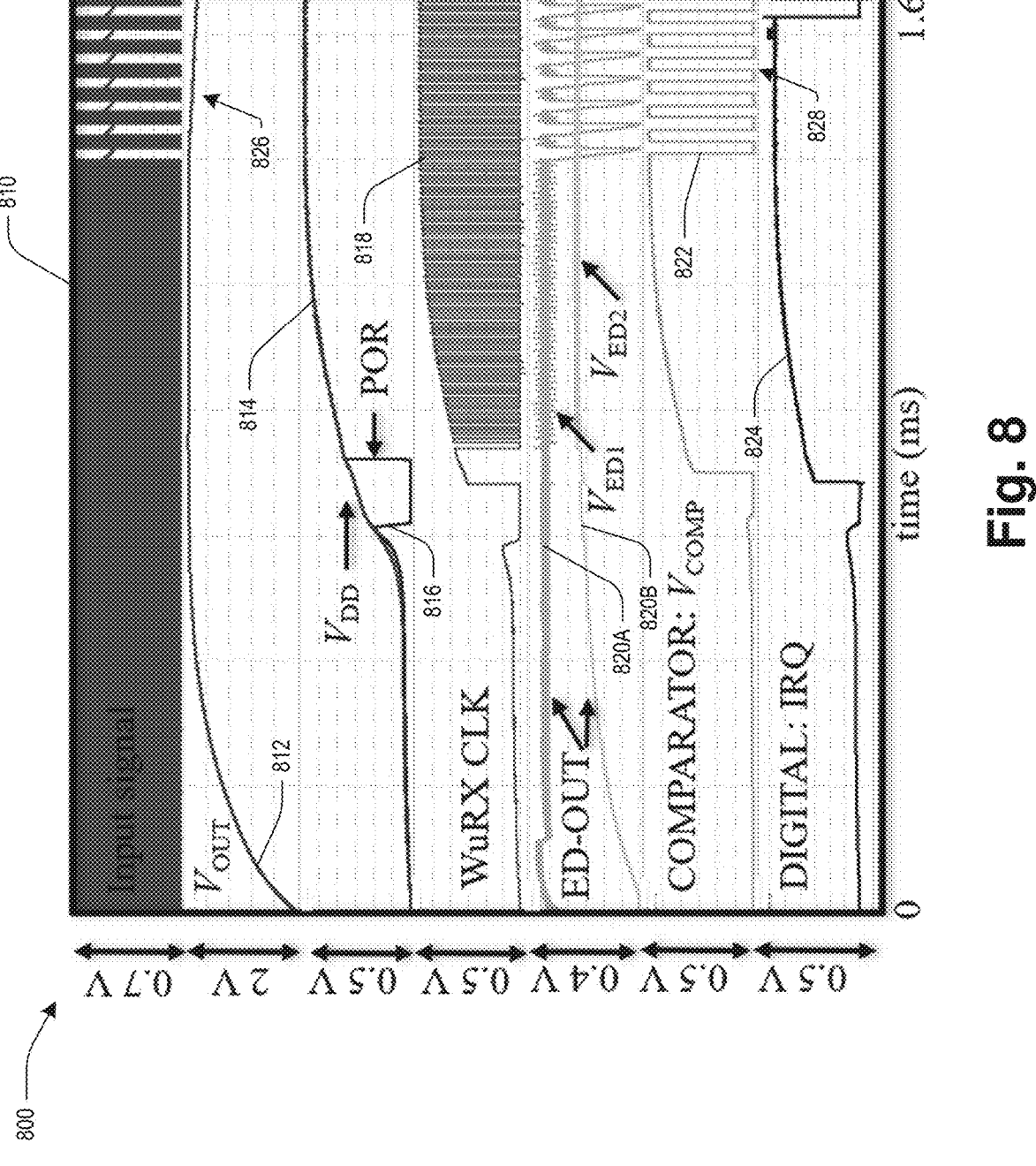

FIGS. 7 and 8 are signal diagrams illustrating operation of the WuRX 100, in accordance with some embodiments. Referring to FIG. 7, a signal diagram 700 illustrating operation of the envelope detector 104 is provided. An RF signal 702 is used for generating power and for signaling a wake-up condition. During the wake-up signaling, the RF signal 702 includes pulses and off periods that define a binary pattern. During the on periods, the $V_{ED1}$ signal 704 reacts quickly due to the reduced time constant compared to the $V_{ED2}$ signal 706. The slew rate evident in the $V_{ED1}$ signal 704 during active discharge is dependent on the multiplier, N, used in the current source 318. The $V_{ED2}$ signal 706 provides an averaging reference for the $V_{ED1}$ signal 704. The comparator 128 identifies a logic "1" when the $V_{ED1}$ signal 704 exceeds the $V_{ED2}$ signal 706 and a logic "0" when the $V_{ED1}$ signal 704 is below the $V_{ED2}$ signal 706.

FIG. 8 illustrates a diagram 800 in the WuRX 100 during a wakeup event. FIG. 8 shows an input RF signal 810, a $V_{OUT}$ signal 812, a $V_{DD}$ signal 814, a POR signal 816, a clock signal 818, a $V_{ED1}$ signal 820A, a $V_{ED2}$ signal 820B, a comparator output signal 822, $V_{COMP}$, and an IRQ signal 824 (e.g., wake-up signal). The initial portion of the RF signal 810 does not include interruptions allowing power to be harvested, as seen in the rising level of the $V_{OUT}$ signal 812. When the $V_{DD}$ signal 814 generated by the LDO regulator 120 exceeds a threshold, the POR signal 816 is asserted. The POR signal 816 resets the digital circuitry in the signal processing unit 108, and the clock 132 starts oscillating. The $V_{ED2}$ signal 820B builds to generate the detection threshold. The wake-up pattern is provided in the RF signal 810 at 826. The pattern is seen in the $V_{ED1}$ signal 820A and the comparator output signal 822. Responsive to the digital correlator 130 detecting the wake-up pattern, the IRQ signal 824 is asserted low at 828.

Figure 9:
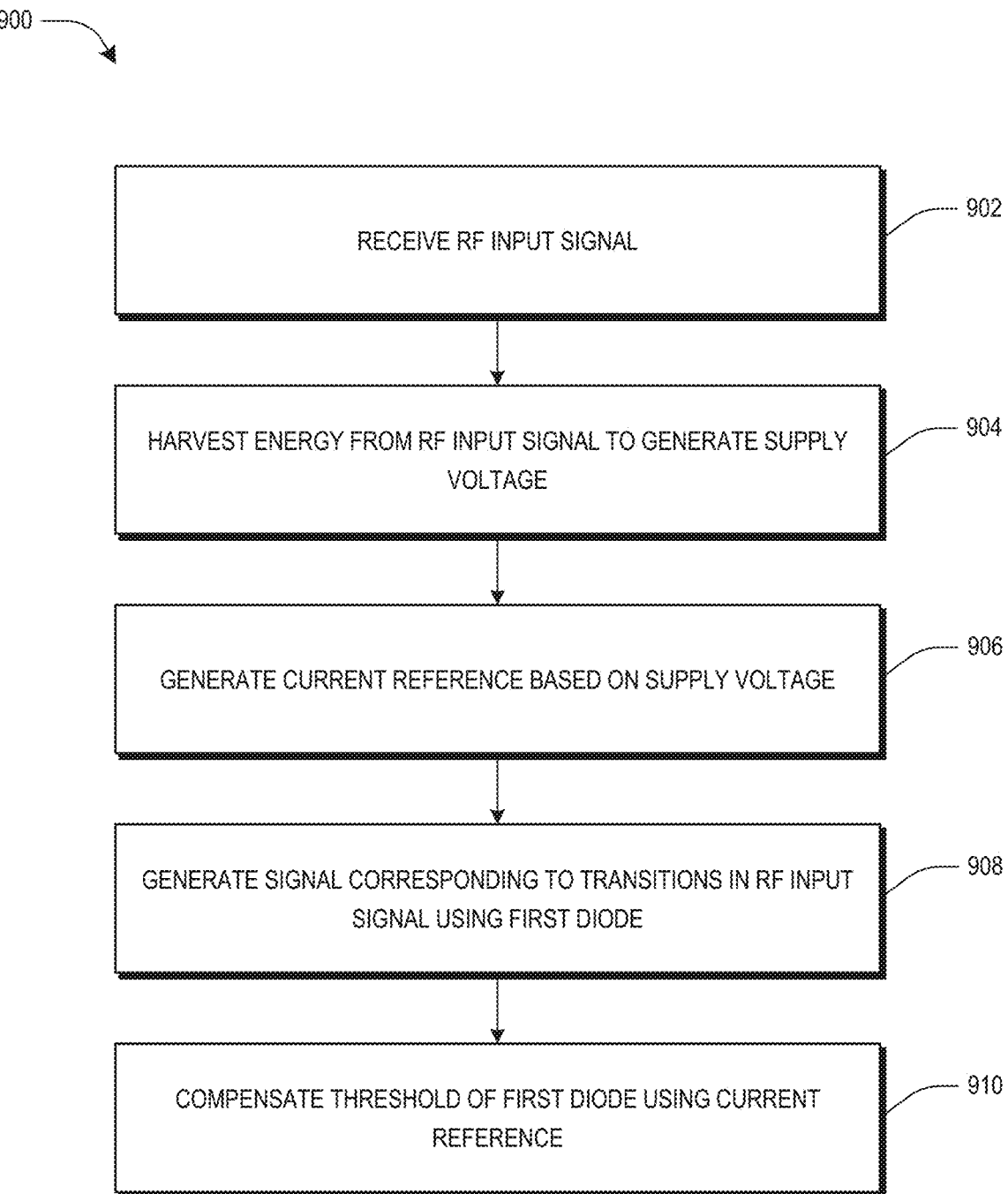
FIG. 9 is a flow chart illustrating an example method for diode threshold compensation, in accordance with some embodiments.

FIG. 9 is a flow chart illustrating an example method 900 for diode threshold compensation, in accordance with some embodiments. At 902, a RF input signal is received. At 904, energy from the RF input signal is harvested to generate a supply voltage. At 906, a current reference is generated based on the supply voltage. At 908, a signal corresponding to transitions in the RF input signal is generated using a first diode. At 910, a threshold of the first diode is compensated using the current reference.

In an example of the techniques presented herein, a wake-up receiver includes a power management unit configured to receive a supply voltage generated from an input signal and generate a current reference. An envelope detector is configured to generate a signal corresponding to transitions in the input signal. A signal processing unit is configured to generate an interrupt signal responsive to detecting a wake-up pattern in the signal from the envelope detector. The envelope detector comprises a first diode threshold compensated by the current reference.

In an example of the techniques presented herein, the wake-up receiver comprises an energy harvester configured to generate the supply voltage based on the input signal.

In an example of the techniques presented herein, the first diode comprises a compensation transistor having a first gate, a first input, and a first output connected to the first gate, a rectification transistor having a second gate and a second output connected to the first input, and a current source connected to a first gate and the second gate and configured to generate the current reference.

In an example of the techniques presented herein, the rectification transistor comprises a first transistor, and a second transistor connected in parallel with the first transistor.

In an example of the techniques presented herein, the compensation transistor comprises a first transistor, and a second transistor connected to the first transistor.

In an example of the techniques presented herein, the second transistor is connected in series with the first transistor.

In an example of the techniques presented herein, the rectification transistor and the compensation transistor comprise p-type transistors.

In an example of the techniques presented herein, the envelope detector comprises a first capacitor connected in parallel with the first diode, and a current source configured to generate an integer multiple of the current reference connected in parallel with the first diode.

In an example of the techniques presented herein, the envelope detector comprises a second diode threshold compensated by the current reference, a second capacitor connected in parallel with the second diode, and a voltage divider connected in parallel with the second diode.

In an example of the techniques presented herein, a system comprises a radio frequency to direct current (RF-DC) converter configured to generate a supply voltage based on an RF input signal, a power management unit configured to receive the supply voltage and generate a current reference, and an envelope detector configured to generate a signal corresponding to transitions in the RF input signal, wherein the envelope detector comprises a first diode threshold compensated by the current reference, and the RF-DC converter comprises a second diode threshold compensated by the current reference.

In an example of the techniques presented herein, the system comprises a storage unit configured to store energy, and a power on reset unit configured to operate the system in a first mode responsive to the supply voltage generated by the RF-DC converter exceeding a minimum voltage to allow receipt of data in the RF input signal and operate the system in a second mode responsive to the supply voltage generated by the RF-DC converter being sufficient to charge the storage unit.

In an example of the techniques presented herein, the system comprises a small loop antenna connected to the RF-DC converter and the envelope detector.

In an example of the techniques presented herein, the first diode comprises a diode connected compensation transistor having a first gate and a first output, a rectification transistor having a second gate and a second output connected to the first output, and a current source connected to a first gate and the second gate and configured to generate the current reference.

In an example of the techniques presented herein, the rectification transistor comprises a first transistor, and a second transistor connected in parallel with the first transistor, and the diode connected compensation transistor comprises a third transistor, and a fourth transistor connected in series with the third transistor.

In an example of the techniques presented herein, the envelope detector comprises a first capacitor connected in parallel with the first diode, a current source configured to generate an integer multiple of the current reference connected in parallel with the first diode, a third diode threshold compensated by the current reference, a second capacitor connected in parallel with the third diode, and a voltage divider connected in parallel with the third diode.

In an example of the techniques presented herein, the second diode comprises an n-type diode, the RF-DC converter comprises a p-type diode threshold compensated by the current reference and connected to the n-type diode, a sampling capacitor is connected to a node between an input of the p-type diode and an output of the n-type diode, and a load capacitor is connected to an output of the p-type diode.

In an example of the techniques presented herein, a method, comprises receiving a radio frequency (RF) input signal, harvesting energy from the RF input signal to generate a supply voltage, generating a current reference based on the supply voltage, generating a signal corresponding to transitions in the RF input signal using a first diode, and compensating a threshold of the first diode using the current reference.

In an example of the techniques presented herein, harvesting energy from the RF input signal comprises compensating a threshold of an n-type diode using the current reference, and compensating a threshold of a p-type diode using the current reference, wherein the n-type diode is connected to the p-type diode, a sampling capacitor is connected to a node between an input of the p-type diode and an output of the n-type diode, and a load capacitor is connected to an output of the p-type diode.

In an example of the techniques presented herein, the method comprises detecting a pattern in the transitions in the RF input signal after the supply voltage exceeds a first voltage, and storing at least some of the energy in an energy storage device responsive to the supply voltage exceeding a second voltage greater than the first voltage.

In an example of the techniques presented herein, generating the signal corresponding to transitions in the RF input signal comprises generating a first reference signal using the first diode, a first capacitor connected in parallel with the first diode, and a current source configured to generate an integer multiple of the current reference connected in parallel with the first diode, and generating a second reference signal using a second diode threshold compensated by the current reference, a second capacitor connected in parallel with the second diode, and a voltage divider connected in parallel with the second diode.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Various operations of embodiments are provided herein. The order in which some or all of the operations are described should not be construed as to imply that these operations are necessarily order dependent. Alternative ordering may be implemented without departing from the scope of the disclosure. Further, it will be understood that not all operations are necessarily present in each embodiment provided herein. Also, it will be understood that not all operations are necessary in some embodiments.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A wake-up receiver, comprising:
a power management unit configured to receive a supply voltage generated from an input signal and generate a bias current;
an envelope detector comprising a first diode, wherein the first diode is threshold compensated by the bias current and configured to generate a signal corresponding to transitions in the input signal; and
a signal processing unit configured to generate an interrupt signal responsive to detecting a wake-up pattern in the signal from the envelope detector.

2. The wake-up receiver of claim 1, comprising:
an energy harvester configured to generate the supply voltage based on the input signal.

3. The wake-up receiver of claim 1, wherein the first diode comprises:
a compensation transistor having a first gate, a first input, and a first output connected to the first gate;
a rectification transistor having a second gate and a second output connected to the first input; and
a current source connected to the first gate and the second gate and configured to generate the bias current.

4. The wake-up receiver of claim 3, wherein the rectification transistor comprises:
a first transistor; and
a second transistor connected in parallel with the first transistor.

5. The wake-up receiver of claim 3, wherein the compensation transistor comprises:
a first transistor; and
a second transistor connected to the first transistor.

6. The wake-up receiver of claim 5, wherein the second transistor is connected in series with the first transistor.

7. The wake-up receiver of claim 3, wherein the rectification transistor and the compensation transistor comprise p-type transistors.

8. The wake-up receiver of claim 1, wherein the envelope detector comprises:
a first capacitor connected in parallel with the first diode; and
a current source configured to generate an integer multiple of the bias current connected in parallel with the first diode.

9. The wake-up receiver of claim 8, wherein the envelope detector comprises:
a second diode, wherein the second diode is threshold compensated by the bias current;
a second capacitor connected in parallel with the second diode; and
a voltage divider connected in parallel with the second diode.

10. A system, comprising:
a radio frequency to direct current (RF-DC) converter comprising a first diode threshold, wherein the first diode is compensated by a bias current and configured to generate a supply voltage based on an RF input signal;
a power management unit configured to receive the supply voltage and generate the bias current;
an envelope detector comprising a second diode, wherein the second diode is threshold compensated by the bias current and configured to generate a signal corresponding to transitions in the RF input signal; and
a signal processing unit configured to generate an interrupt signal responsive to detecting a wake-up pattern in the signal from the envelope detector.

11. The system of claim 10, comprising:

a storage unit configured to store energy; and a power on reset unit configured to operate the system in a first mode responsive to the supply voltage generated by the RF-DC converter exceeding a minimum voltage to allow receipt of data in the RF input signal and operate the system in a second mode responsive to the supply voltage generated by the RF-DC converter being sufficient to charge the storage unit.

12. The system of claim 10, comprising:

a small loop antenna connected to the RF-DC converter and the envelope detector.

13. The system of claim 10, wherein the first diode comprises:

a diode connected compensation transistor having a first gate and a first output;

a rectification transistor having a second gate and a second output connected to the first output; and a current source connected to the first gate and the second gate and configured to generate the bias current.

14. The system of claim 13, wherein:

the rectification transistor comprises:

a first transistor; and a second transistor connected in parallel with the first transistor, and the diode connected compensation transistor comprises:

a third transistor; and a fourth transistor connected in series with the third transistor.

15. The system of claim 10, wherein the envelope detector comprises:

a first capacitor connected in parallel with the first diode;

a current source configured to generate an integer multiple of the bias current connected in parallel with the first diode;

a third diode, wherein the third diode is threshold compensated by the bias current;

a second capacitor connected in parallel with the third diode; and a voltage divider connected in parallel with the third diode.

16. The system of claim 10, wherein:

the second diode comprises an n-type diode, the RF-DC converter comprises a p-type diode threshold compensated by the bias current and connected to the n-type diode, a sampling capacitor is connected to a node between an input of the p-type diode and an output of the n-type diode; and a load capacitor is connected to an output of the p-type diode.

17. A method, comprising:

receiving a radio frequency (RF) input signal;

harvesting energy from the RF input signal to generate a supply voltage;

generating a bias current based on the supply voltage;

generating a signal corresponding to transitions in the RF input signal using a first diode generating an interrupt signal responsive to detecting a wake-up pattern in the signal; and compensating a threshold of the first diode using the bias current.

18. The method of claim 17, wherein harvesting energy from the RF input signal comprises:

compensating a threshold of an n-type diode using the bias current; and compensating a threshold of a p-type diode using the bias current, wherein:

the n-type diode is connected to the p-type diode, a sampling capacitor is connected to a node between an input of the p-type diode and an output of the n-type diode; and a load capacitor is connected to an output of the p-type diode.

19. The method of claim 17, comprising:

detecting a pattern in the transitions in the RF input signal after the supply voltage exceeds a first voltage; and storing at least some of the energy in an energy storage device responsive to the supply voltage exceeding a second voltage greater than the first voltage.

20. The method of claim 17, wherein generating the signal corresponding to transitions in the RF input signal comprises:

generating a first reference signal using the first diode, a first capacitor connected in parallel with the first diode, and a current source configured to generate an integer multiple of the bias current connected in parallel with the first diode; and generating a second reference signal using a second diode threshold compensated by the bias current, a second capacitor connected in parallel with the second diode, and a voltage divider connected in parallel with the second diode.

* * * * *